United States Patent [19]

Leverenz et al.

[11] Patent Number: 5,958,569
[45] Date of Patent: Sep. 28, 1999

[54] ANCHORED OXIDE COATINGS ON HARD METAL CUTTING TOOLS

[75] Inventors: Roy V. Leverenz, Smyrna; John Bost, Franklin, both of Tenn.

[73] Assignee: Teledyne Industries, Inc., Lavergne, Tenn.

[21] Appl. No.: 08/860,163

[22] PCT Filed: Oct. 23, 1996

[86] PCT No.: PCT/US96/17107

§ 371 Date: Jun. 16, 1997

§ 102(e) Date: Jun. 16, 1997

[87] PCT Pub. No.: WO97/15411

PCT Pub. Date: May 1, 1997

Related U.S. Application Data

[60] Provisional application No. 60/005,952, Oct. 27, 1995.

[51] Int. Cl.[6] .................................. C23C 9/00; B32B 9/04
[52] U.S. Cl. .......................... 428/216; 51/307; 51/309; 427/255; 427/249; 427/255.1; 427/255.2; 427/255.7; 428/141; 428/156; 428/336; 428/469; 428/698; 428/701; 428/702

[58] Field of Search ................................ 428/698, 701, 428/702, 457, 469, 216, 336, 156, 141; 427/255, 255.1, 255.2, 255.7, 249; 51/307, 309

[56] References Cited

U.S. PATENT DOCUMENTS

| 4,101,703 | 7/1978 | Schintlmeister | 428/216 |
| 4,610,931 | 9/1986 | Nenmeth et al. | 428/547 |
| 5,372,873 | 12/1994 | Yoshimura et al. | 428/216 |

*Primary Examiner*—Archene Turner
*Attorney, Agent, or Firm*—Webb Ziesenheim Logsdon Orkin & Hanson, P.C.

[57] ABSTRACT

A cutting tool insert comprises a hard metal substrate having at least two wear-resistant coatings including an exterior ceramic coating and a coating under the ceramic coating being a metal carbonitride having a nitrogen to carbon atomic ratio between 0.7 and 0.95 which causes the metal carbonitride to form projections into the ceramic coating improving adherence and fatigue strength of the ceramic coating.

10 Claims, 2 Drawing Sheets

ANCHORED OXIDE COATINGS ON HARD METAL CUTTING TOOLS

This application claims benefit of provisional application 60/005,952, filed Oct. 27, 1995.

FIELD OF THE INVENTION

The present invention relates to the field of cutting tools and particularly to coatings for ceramic coated hard metal cutting tool inserts used for cutting, milling, drilling and other applications such as boring, trepanning, threading and grooving.

BACKGROUND OF THE INVENTION

Coatings improve the performance of cutting tools, especially ceramic or oxide coatings on carbide or hard metal cutting tools. Ever since carbide cutting tool inserts have been ceramic coated with, for example, aluminum oxide ($Al_2O_3$), there has been a continuing effort to improve the adherence of the coating to the substrate. When the first aluminum oxide coating was applied directly to a substrate of the carbide or hard metal type, the oxygen in the aluminum oxide reacted with the substrate which reduced the adherence.

It has been known to improve the properties of tool inserts made from a sintered hard metal substrate (metallic carbide bonded with a binder metal) by applying a wear-resistant carbide layer. See UK Patents Nos. 1,291,387 and 1,291,388 which disclose methods of applying a carbide coating with improved adherence; specifically, controlling the composition of the gas used for deposition of the carbide so that a decarburized zone was formed in the sintered hard metal at the interface with the wear-resistant carbide. The decarburized zone known as an eta layer, however, tends to be hard and brittle resulting in breakage. It has also been known to apply a ceramic or oxide wear-resistant coating (usually aluminum oxide) upon the sintered metal substrate. However, as already explained, the oxide layer directly upon the sintered metal body may disrupt the sintered metal morphology and binding ability. A number of patents have disclosed the use of an intermediate layer of carbides, carbonitrides and/or nitrides. See U.S. Pat. Nos. 4,399,168 and 4,619,866. An intermediate titanium carbide (TiC) layer improved toughness but still an eta layer existed limiting the application of the coated tool inserts to finishing cuts. A layer of titanium nitride (TiN) applied before the TiC layer eliminated the eta layer but toughness was still less than required. See U.S. Patent No. 4,497,874. Intermediate layers of titanium carbonitride (TiCN) in place of the TiC intermediate layer have been proposed. See U.S. Patents Nos. 4,619,866 and 4,399,168. A thin surface oxidized bonding layer comprising a carbide or oxycarbide of at least one of tantalum, niobium and vanadium between the hard metal substrate and the outer oxide wear layer has been proposed. See U.S. Pat. No. 4,490,191.

The ceramic coating ($Al_2O_3$) does not adhere well enough to the TiC and many TiCN intermediate coatings when used to enhance the adhesion of the coating to the cemented carbide substrate. Due to thermal expansion differences, there is a tendency to delaminate. With the stress caused by the thermal expansion difference, coatings tend to perform inconsistently. These intermediate coatings are mostly characterized by a straight line interface between the intermediate coating and the oxide coating as shown in FIG. 1. This results in a weak bond. Adhesion may be increased some by making the substrate rough but the projections provided by the roughening are spaced too far apart to perform consistently.

With the coatings, according to the present invention, increased wear resistance as well as adhesion strength are provided in ceramic coatings on hard metal cutting tools.

SUMMARY OF THE INVENTION

Briefly, according to this invention, there is provided a cutting tool insert comprising a hard metal substrate having at least two wear-resistant coatings. One of the coatings is a ceramic coating. An intermediate coating under the ceramic coating is comprised of carbonitride having a nitrogen to carbon atomic ratio between about 0.7 and about 0.95 whereby the carbonitride coating forms fingers interlocking the ceramic coating, thus improving the adherence and fatigue strength of the ceramic coating. Preferably, the nitrogen to carbon atomic ratio in the carbonitride coating lies between about 0.75 and 0.95 as determined by X-ray diffraction.

According to one embodiment of this invention, the hard metal cutting tool insert has two intermediate coatings between the hard metal substrate and the aluminum oxide surface coating. The coating adjacent the substrate is a 1 to 4 micron layer of titanium nitride. The coating over the titanium nitride layer is a 2 to 4 micron thick titanium carbonitride layer and the aluminum oxide coating is a 1 to 10 micron layer.

According to a preferred embodiment, the hard metal substrate of the cutting tool insert has four coatings as follows: a 2 micron titanium nitride interior coating, a 3 micron titanium carbonitride intermediate coating, a 6 micron aluminum oxide intermediate coating, and a 2 micron Ti (C,N), i.e., TiC, TiN, $TiC_xN_y$ exterior coating.

Titanium is not the only suitable metal for use in the carbonitride coating. The metal may be comprised of, in addition to titanium, zirconium, hafnium, vanadium, niobium, tantalum, chromium, molybdenum and tungsten.

The cutting tool insert substrate, according to this invention, typically comprises 3% to 30% of a binder metal from the iron group including, in addition to iron, nickel and cobalt and mixtures thereof and between 70% and 97% of a carbide selected from the group tungsten carbide, titanium carbide, tantalum carbide, niobium carbide, molybdenum carbide, zirconium carbide and hafnium carbide. In addition to carbides, the cutting tool insert substrate may also include nitrides.

According to a preferred embodiment, the cutting tool insert substrate has a binder phase enriched surface layer, that is, a surface layer enriched with a higher percentage of cobalt or other binder metal.

Briefly, according to this invention, there is provided a method of making a coated cutting tool insert having a wear-resistant coating comprising the steps of depositing a metal carbonitride coating having a nitrogen to carbon atomic ratio between about 0.7 and about 0.95 by adjusting the reactants used for chemical vapor deposition of said coating and depositing a ceramic coating directly over said carbonitride coating whereby said carbonitride coating and ceramic coating have interlocking microscopic fingers.

BRIEF DESCRIPTION OF THE DRAWINGS

Further features and other objects and advantages of this invention will become clear from the following detailed description made with reference to the drawings in which.

DESCRIPTION OF THE PREFERRED EMBODIMENTS

Figure 1:
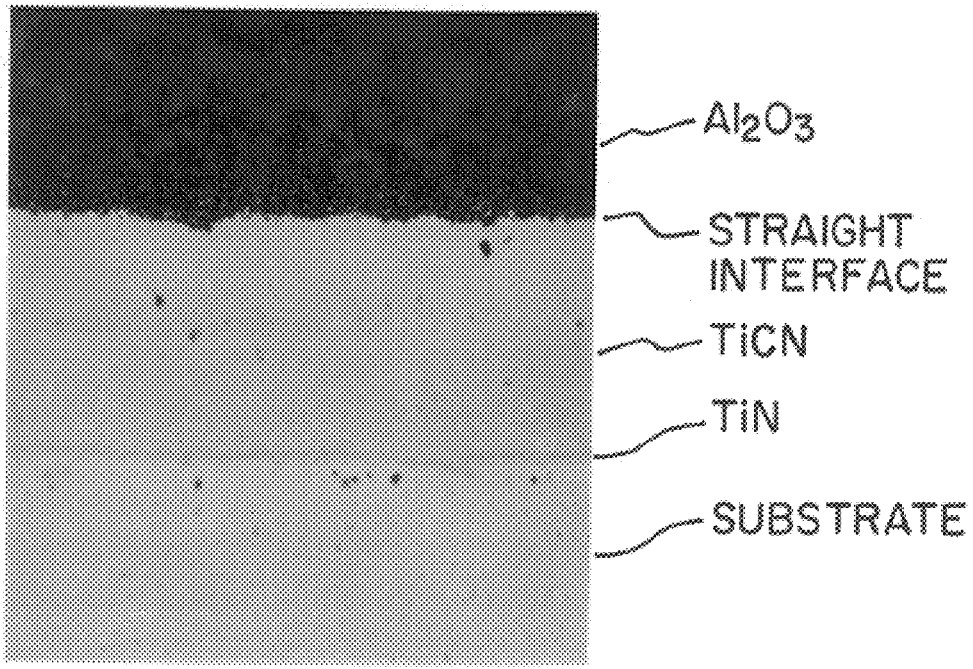
FIG. 1 is a photomicrograph of a polished section of a hard metal cutting tool insert having an oxide coating and an intermediate coating according to the prior art.

According to this invention, hard metal cutting tools with a ceramic or oxide wear-resistant coating have a novel reinforcing intermediate coating. The hard metal substrate has a thin metal nitride coating overlaid with a titanium carbonitride coating. The wear-resistant ceramic coating overlays the metal carbonitride coating. The metal carbonitride intermediate layer is provided with a nitrogen to carbon atomic ratio that results in superior adherence of the oxide coating due to the development of interlocking fingers between the oxide coating and the metal carbonitride coating.

A test was devised to quantitatively evaluate the performance of ceramic coated hard metal cutting tool inserts. The test is performed on a turning machine. The stock is a cylindrical bar having a diameter greater than about 4 inches. The bar has four axial slots ¾ inch wide and 1½ inches deep extending the length of the bar. The bar is medium carbon steel AISI-SAE 1045 having a hardness of 25–30 HRC. The tools to be tested were used to reduce the diameter of the stock as follows.

| Feed Rate (inches per revolution or IPR) | Depth of Cut (inches) | Speed (surface feet per minute or SFM) |
|---|---|---|
| .020 | .050 | 500 |

It should be apparent that four times per revolution of the stock, the cutting tool insert impacts the edge of a slot. The cutting tool insert is run until it breaks through the coating or another failure is observed. Failures were observed in the following described test and were of the fretting type which is a precursor to the greater wear and cutting failure type.

In the following examples, the nitrogen to carbon atomic ratio in the titanium carbonitride intermediate layer or coating was determined by use of X-ray diffraction to first detect the lattice spacing of the carbonitride layer and then to calculate the atomic ratio of nitrogen to carbon or the atomic percentage of nitrogen based upon nitrogen and carbon. The lattice spacing of titanium carbide is known to be 1.53 Angstroms and the lattice spacing for titanium nitride is known to be 1.5 Angstroms. The range or difference is 0.03 Angstroms. Thus, a titanium carbonitride layer found to have a lattice spacing of 1.5073 Angstroms is 0.0227 Angstroms between the spacing for titanium nitride and titanium carbide. Hence, the atomic ratio of nitrogen to carbon is 0.0227 divided by 0.03 or 75.7% nitrogen based on total carbon and nitrogen in the carbonitride layer.

EXAMPLE I

Comparative Example

A tungsten carbide based substrate (94% tungsten carbide, 6% cobalt) of K20 material (K20 is a designation of the type of hard cutting material for machining as set forth in ISO Standard IS0513:1991(E) classified according to the materials and working conditions for which the hard metal cutting material can appropriately be used) was coated according to well-known procedures in a Bernex Programmat 250 coating furnace. The coating process known as chemical vapor deposition (CVD) was used where gasses and liquids (converted to gas) are passed over substrates to be coated at 800° to 1,1000° C. and reduced pressures from 50 to 900 mBAR. The reactions used to coat the hard metal substrate were as follows:

CVD of TiN–uses $H_2+N_2$+Titanium Tetrachloride ($TiCl_4$)

CVD of TiCN–uses $H_2+N_2+TiCl_4$+Acetonitrile ($CH_3CN$) or $CH_4$

CVD of $Al_2O_3$–uses $H_2$+HCl+Aluminum Chloride ($AlCl_3$)+$CO_2$+$H_2S$

The essential coating periods and atmospheres used to apply the titanium nitride layer, the titanium carbonitride layer and the oxide layer are set forth in the following Tables I, II and III. The gas reactants, the product of the $AlCl_3$ reactor and the liquid reactions are introduced to the furnace.

TABLE I

| Coating | Run Time Minutes | Millibar Reactor Pressure | ° C. Reactor Temp. |
|---|---|---|---|
| TiN | 60 | 160 | 920 |
| TiCN | 420 | 60 | 870 |
| $Al_2O_3$ | 270 | 60 | 1005 |

TABLE II

| | Gas Reactants Liter/Minute | | | | | |
|---|---|---|---|---|---|---|
| Coating | $H_2$ | $N_2$ | $CO_2$ | $CH_4$ | HCl | $H_2S$ |
| TiN | 14 | 9 | | | | |
| TiCN | 14 | 8 | | | | |
| $Al_2O_3$ | 11 | | 0.6 | | .20 | 0.050 |

TABLE III

| | $AlCl_3$ Gas Generator l/min | | Liquid Reactants ml/min | |
|---|---|---|---|---|
| Coating | $H_2$ | HCl | $CH_3CN$ Liquid | $TiCl_4$ Liquid |
| TiN | | | | 2.1 |
| TiCN | | | 125 | 2.4 |
| $Al_2O_3$ | 1.9 | 0.8 | | |

X-ray analysis of the titanium carbonitride layer demonstrated a lattice spacing of 1.516 Angstroms which, based on the analysis explained above, represents a nitrogen to carbon atomic ratio of 14:30 or a nitrogen content of 46.7% based on the total carbon and nitrogen in the carbonitride layer. The coated tool according to this example was submitted to the above-described machining test. After only 14.5 seconds, fretting was displayed.

FIG. 1 is a photomicrograph of a polished section showing the layers or coatings over the substrate. Notice that the interface between the titanium carbonitride and oxide layer is almost a straight line, that is, there are no interlocking fingers.

EXAMPLE II

A coating, according to this invention, was prepared on a tungsten carbide based substrate in the coating furnace above described with the coating periods and atmospheres as described in Tables IV, V and VI.

TABLE IV

| Coating | Run Time Minutes | Millibar Reactor Pressure | °C. Reactor Temp. |
| --- | --- | --- | --- |
| TiN | 60 | 160 | 920 |
| TiCN | 240 | 80 | 1005 |
| Al$_2$O$_3$ | 540 | 60 | 1005 |

TABLE V

| Coating | Gas Reactants Liter/Minute | | | | | |
| --- | --- | --- | --- | --- | --- | --- |
| | H$_2$ | N$_2$ | CO$_2$ | CH$_4$ | HCl | H$_2$S |
| TiN | 14 | 9 | | | | |
| TiCN | 11.3 | 8 | | 0.6 | | |
| Al$_2$O$_3$ | 11 | | 0.6 | | 0.2 | .050 |

TABLE VI

| Coating | AlCl$_3$ Gas Generator l/min | | Liquid Reactants ml/min | |
| --- | --- | --- | --- | --- |
| | H$_2$ | HCl | CH$_3$CN Liquid | TiCl$_4$ Liquid |
| TiN | | | | 2.1 |
| TiCN | | | | 0.9 |
| Al$_2$O$_3$ | 1.9 | 0.8 | | |

Tables IV, V and VI, in addition to showing the run times, reaction pressures and temperatures, show the rate of gas reactants, aluminum chloride generator reactants and the liquid reactants. The gas reactants introduced into the aluminum chloride generator flow over aluminum metal chips producing a quantity of aluminum chloride which is passed into the coating furnace.

X-ray analysis of the titanium carbonitride layer demonstrated a lattice spacing of 1.5073 which, based on the analysis explained above, represents a nitrogen to carbon ratio of 23:30 or a nitrogen content of 75.7% based upon the total carbon and nitrogen in the carbonitride layer.

Figure 2:
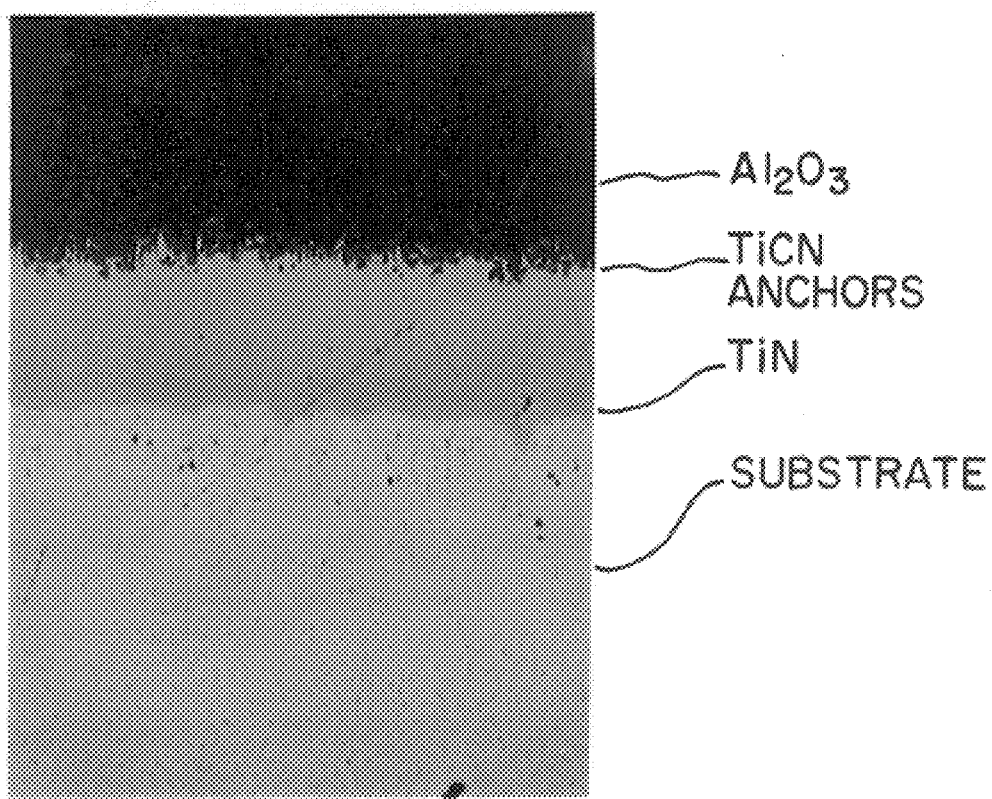
FIGS. 2–4 are photomicrographs of polished sections of hard metal cutting tool inserts, according to this invention, having an intermediate coating and an oxide coating.

The coated tool insert was submitted to the above-described machining test. The cutting test showed no fretting at 180 seconds. FIG. 2 is a photomicrograph of a polished section showing the layers of coating over the substrate. The photomicrograph illustrates fingers or anchors of the titanium carbonitride layer penetrating the oxide layer and anchoring it in place.

EXAMPLE III

Example III was prepared the same as Example II except the nitrogen was lower in the coating furnace during the deposition of the carbonitride layer. The lattice spacing in the titanium carbonitride layer was found to be 1.509 which represents a nitrogen to carbon atomic ratio of 21:30 or a nitrogen content of 70%.

Figure 3:
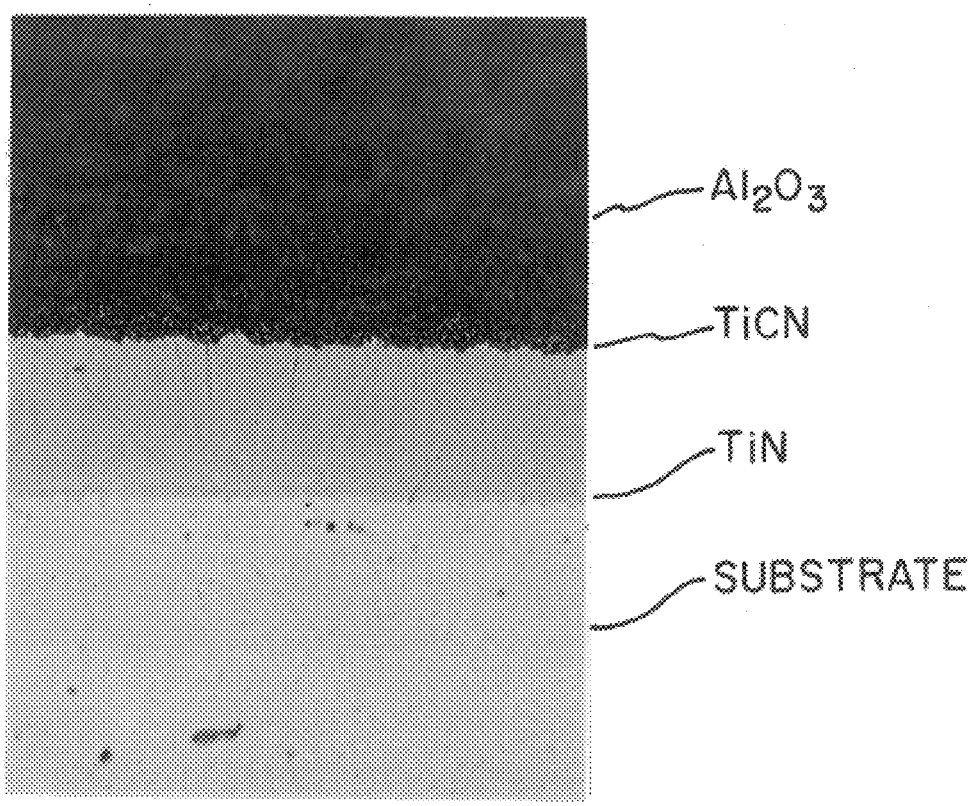

In the machining test, fretting was displayed only after a 5 inch cut length (estimated 40 to 50 seconds). The microstructure of Example II shown in FIG. 3 anchors between the oxide and the titanium carbonitride layers are displayed but are very minor.

EXAMPLE IV

Figure 4:
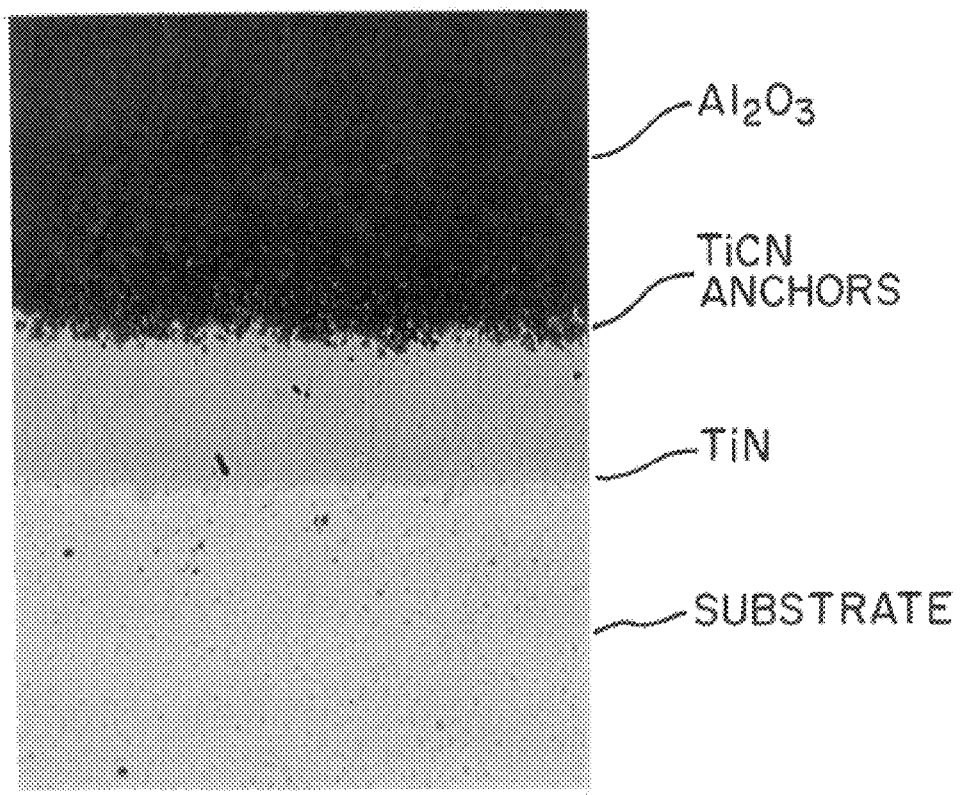

Example IV was prepared the same as Example II except with increased nitrogen flow. The lattice spacing of the titanium carbonitride layer was 1.503 Angstroms which represents a nitrogen to carbon atomic ratio of 27:30 or 90% nitrogen. In the machining test, the tool insert displayed no fretting after 120 seconds. The microstructure of Example IV is shown in FIG. 4 and illustrates prominent fingers or anchors extending between the carbonitride layer and the oxide layer.

EXAMPLE V

In the following example, tool inserts coated according to this invention were machine tested with the following cutting conditions. The stock was 3,000 gray cast iron 200 BHN. The tools tested were used to reduce the diameter of the stock as follows.

| Feed Rate (inches per revolution or IPR) | Depth of Cut (inches) | Speed (surface feet per minute or SFM) |
| --- | --- | --- |
| .022 | .100 | 950 |

Two steel inserts, according to this invention, ran 108 pieces per edge. By comparison, a C-5 alumina coated tool insert ran 50 pieces per edge. The tool inserts, according to this invention, were a 100% improvement.

EXAMPLE VI

In the following example, the stock for the machining test was ARMA steel 250 BHN. The machining conditions were as follows.

| Feed Rate (inches per revolution or IPR) | Depth of Cut (inches) | Speed (surface feet per minute or SFM) |
| --- | --- | --- |
| .010 | .100 | 1,200 |

Using the tool inserts, according to this invention, 170 pieces per edge were run. By comparison, with C-5 alumina coated tool inserts, 85 pieces per edge were run. The tool inserts, according to this invention, were a 100% improvement.

Having thus described our invention with the detail and particularity required by the Patent Laws, what is desired protected by Letters Patent is set forth in the following claims.

What is claimed is:

1. A cutting tool insert comprising a hard metal substrate having at least two wear-resistant coatings including an exterior ceramic coating and a coating under the ceramic coating being a metal carbonitride having a nitrogen to carbon atomic ratio between 0.7 and 0.95 which causes the metal carbonitride to form projections into the ceramic coating whereby improving adherence and fatigue strength of the ceramic coating.

2. The cutting tool insert as set forth in claim 1, wherein the metal carbonitride has a nitrogen content of between 70% and 90% based upon the total nitrogen and carbon content of the metal carbonitride layer.

3. The cutting tool insert as set forth in claim 1, wherein the metal carbonitride has a nitrogen to carbon atomic ratio between 0.75 and 0.95 as determined by X-ray diffraction.

4. A cutting tool insert as set forth in claim 1, having a coating of titanium nitride 1 to 4 microns thick, a titanium carbonitride coating 2 to 4 microns thick, and an aluminum oxide coating of 1 to 10 microns thick.

5. A cutting tool insert according to claim 3, having a titanium nitride coating 2 microns thick, a titanium carbonitride coating 3 microns thick and an aluminum oxide coating 6 microns thick with an overcoating of Ti (C,N) 2 microns thick.

6. A cutting tool insert as set forth in claim 1, wherein the metal in the metal carbonitride coating is selected from one of the groups IVB, VB and VIB in the periodic table of elements.

7. A cutting insert as set forth in claim 6, and including a substrate composed of 3% to 30% binder metal from the iron group and between 70% and about 97% carbide selected from the group tungsten carbide, titanium carbide, tantalum carbide, niobium carbide, molybdenum carbide, zirconium carbide and hafnium carbide.

8. A cutting tool insert as set forth in claim 7, wherein in the substrate nitrides replace a portion of the carbides.

9. A cutting tool insert as set forth in claim 6, wherein the surface layer of the substrate is enriched with the binder metal.

10. A method of making a cutting tool insert comprising the steps of applying a titanium nitride coating, a metal carbonitride coating and a ceramic coating, all by chemical vapor deposition, wherein the reactants during the chemical vapor deposition of the carbonitride layer are controlled to provide a nitrogen to carbon atomic ratio between 0.75 and 0.95 and wherein a ceramic coating is deposited thereover such that the carbonitride layer has fingers which extend into the ceramic coating increasing coating adhesion.

* * * * *

UNITED STATES PATENT AND TRADEMARK OFFICE
CERTIFICATE OF CORRECTION

PATENT NO. : 5,958,569
DATED : September 28, 1999
INVENTOR(S) : Roy V. Leverenz et al.

It is certified that error appears in the above-identified patent and that said Letters Patent is hereby corrected as shown below:

Column 4 Line 3 "1,1000°C" should read --1,100°C--.

Signed and Sealed this

Thirtieth Day of May, 2000

Attest:

Q. TODD DICKINSON

*Attesting Officer*     *Director of Patents and Trademarks*